(12) United States Patent
Burger

(10) Patent No.: US 9,733,290 B2
(45) Date of Patent: Aug. 15, 2017

(54) SENSOR DEVICE AND METHOD FOR CAPACITIVE APPROXIMATION DETECTION

(75) Inventor: Stefan Burger, München (DE)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 195 days.

(21) Appl. No.: 13/977,723

(22) PCT Filed: Jan. 3, 2012

(86) PCT No.: PCT/EP2012/050058
§ 371 (c)(1),
(2), (4) Date: Feb. 24, 2014

(87) PCT Pub. No.: WO2012/093123
PCT Pub. Date: Jul. 12, 2012

(65) Prior Publication Data
US 2014/0361795 A1 Dec. 11, 2014

(30) Foreign Application Priority Data

Jan. 4, 2011 (DE) .................... 10 2011 002 446

(51) Int. Cl.
*G01R 27/26* (2006.01)
*G01R 1/30* (2006.01)
*H03K 17/955* (2006.01)

(52) U.S. Cl.
CPC ........... *G01R 27/2605* (2013.01); *G01R 1/30* (2013.01); *H03K 17/955* (2013.01); *H03K 2217/960745* (2013.01); *H03K 2217/960775* (2013.01)

(58) Field of Classification Search
CPC .... G01R 27/2605; G01R 1/30; H03K 17/955; H03K 2217/960745; H03K 2217/960775
(Continued)

(56) References Cited

U.S. PATENT DOCUMENTS 4,778,951 A * 10/1988 Pepper, Jr. .............. G06F 3/045
178/18.01
5,598,146 A 1/1997 Schroder ....................... 340/602
(Continued)

FOREIGN PATENT DOCUMENTS

DE    2812388 C2   10/1979
DE    19812626 A1   9/1999
(Continued)

OTHER PUBLICATIONS

Zangl, Hubert, European Patent Office Document 1914521 A2, Method for determining partial capacity in capacitative sensors— Translation, Apr. 23, 2008, Espacenet Patent, All Pages.*
(Continued)

*Primary Examiner* — Melissa Koval
*Assistant Examiner* — Rahul Maini
(74) *Attorney, Agent, or Firm* — Slayden Grubert Beard PLLC

(57) ABSTRACT

A capacitive sensor device with an electrode system has a first transmitting electrode and a first reception electrode, wherein the first transmitting electrode can be brought into capacitive coupling with the first reception electrode, and a second transmitting electrode and a second reception electrode, wherein the second transmitting electrode can be brought into capacitive coupling with the second reception electrode, a signal generator for feeding the first transmitting electrode with a first electric alternating signal and the second transmitting electrode with a second electric alternating signal, and a signal processing device, which is coupled with the first reception electrode and with the second reception electrode, and which is adapted to form a first measurement variable from the difference between a first electric value tapped at the first reception electrode and
(Continued)

a second electric value tapped at the second reception electrode.

22 Claims, 2 Drawing Sheets

(58) Field of Classification Search
USPC .................................................. 324/672, 658
See application file for complete search history.

(56) References Cited

U.S. PATENT DOCUMENTS

| | | | |
|---|---|---|---|
| 6,335,684 B1 | 1/2002 | Eisenmann et al. ........... 340/562 |
| 6,596,507 B2 * | 7/2003 | Ossart .............. G01N 33/48735 |
| | | | 435/283.1 |
| 7,880,481 B2 * | 2/2011 | Zangl ...................... G01D 5/24 |
| | | | 324/684 |
| 8,089,289 B1 * | 1/2012 | Kremin et al. ................ 324/678 |
| 8,106,668 B2 * | 1/2012 | Matsushima ................. 324/686 |
| 8,573,700 B2 * | 11/2013 | Togura ................... B60N 2/002 |
| | | | 297/216.12 |
| 2004/0158439 A1 * | 8/2004 | Kim ....................... G01D 21/02 |
| | | | 702/190 |

FOREIGN PATENT DOCUMENTS

| | | | |
|---|---|---|---|
| DE | 102007026307 A1 * | 2/2008 | ........... H03K 17/955 |
| DE | 202009017337 U1 | 4/2010 | |
| EP | 0753438 A1 | 1/1997 | ............. B32B 17/10 |
| EP | 1914521 A2 * | 4/2008 | ........... G01D 5/2405 |
| EP | 2661812 B1 | 5/2015 | |
| WO | 97/29391 A1 | 8/1997 | ............... G01V 3/08 |
| WO | 2012/093123 A1 | 7/2012 | ........... H03K 17/955 |

OTHER PUBLICATIONS

International Search Report and Written Opinion, Application No. PCT/EP2012/050058, 12 pages, Feb. 29, 2012.

Chinese Office Action, Application No. 201280006242.0, 5 pages, Sep. 6, 2015.

Kories et al., "Taschenbuch der Elektronik," Wechselstrombrücken, Section 3.7.6, Harri Deutsch, ISBN: 3817116268, pp. 156-157 (German w/ English translation), 2000.

European Notice of Opposition, Application No. 12701072.6, 16 pages, Feb. 22, 2016.

European Summons to Attend Oral Hearing, Application No. 12701072.6, 19 pages, Nov. 18, 2016.

* cited by examiner

SENSOR DEVICE AND METHOD FOR CAPACITIVE APPROXIMATION DETECTION

CROSS-REFERENCE TO RELATED APPLICATIONS

This application is a U.S. National Stage Application of International Application No. PCT/EP2012/050058 filed Jan. 3, 2012, which designates the United States of America, and claims priority to DE Patent Application No. 10 2011 002 446.8 filed Jan. 4, 2011. The contents of which are hereby incorporated by reference in their entirety.

TECHNICAL FIELD

The invention relates to a capacitive sensor device for detecting an approach of an object to the sensor electrodes of the sensor device as well as a method for the approximation detection of an object by means of a capacitive sensor device according to the invention. Moreover the invention concerns an electric device, especially an electric hand-held device with a capacitive sensor device according to the invention, which is adapted to perform the method according to the invention.

BACKGROUND

In capacitive distance or proximity sensors the distance between the sensor and an electrically conductive object is measured without contact by generating and measuring electric alternating fields. From the measuring signal functions can be derived, for example switching functions.

A disadvantage of the capacitive sensors known from prior art is that they can be influenced by interfering electric fields from the environment of the capacitive sensor or of the sensor electrodes of the capacitive sensor, which can have a negative impact on the result of the measurement. Another disadvantage consists in the fact that the measuring signal depends on the grounding conditions of the capacitive sensor on the one hand and on the object which approaches the capacitive sensor on the other hand. If the concrete grounding conditions of the capacitive sensor or of the object are not known, a correct measurement of the distance between the sensor electrodes and the object or of an approach of the object to the sensor electrodes of the capacitive sensor cannot be guaranteed.

To detect the distance or approximation of an object without contact various principles are known from prior art, which vary in the way of signal generation and measurement as well as the number of necessary sensor electrodes.

A first principle known from prior art for capacitive distance or approximation detection provides for the use of a capacitive distance sensor with only one electrode. In this measurement system the capacitance of the electrode in relation to the ground potential of the measuring electronics of the capacitive distance sensor is measured. If an object for example a user, approaches the sensor electrode, the capacitance at the sensor electrode increases, which can be measured and evaluated accordingly.

Another measurement system provides a capacitive distance or proximity sensor with two sensor electrodes. One sensor electrode is operated as transmitting electrode and the other sensor electrode as reception electrode. The electric alternating field emitted at the transmitting electrode is coupled into the reception electrode and measured by means of an electrical signal tapped at the reception electrode. In case of approach of a user to the sensor electrodes the alternating electric field formed between the transmitting electrode and the reception electrode changes, which can be measured and evaluated accordingly.

A still further measurement system known from prior art provides a capacitive sensor with three sensor electrodes. Here two electrodes are operated as transmitting electrode and the third electrode as reception electrode. The transmission electrodes are controlled in phase or anti-phase. At the reception electrode a sum of the alternating electric fields emitted at the transmission electrodes is measured. In case of approach of a user the alternating electric field coupled into the reception electrode, which results from the electric alternating fields emitted at the transmission electrodes, changes. The change of the alternating electric field coupled into the reception electrode can accordingly be evaluated.

The three measuring principles known from prior art have in common the two already mentioned problems, i. e. the measuring signal
- can be disturbed by external interfering electric fields, and/or
- depends on how the sensor electronics and/or the object approaching the sensor electrodes are grounded.

In the state of the art one tries to reduce these problems by appropriate measures, for example by
- analogue or digital filtration of the measuring signal, and/or
- appropriate choice of the moment of measurement and/or by appropriate choice of the measuring cycle, and/or
- processing additional information and/or evaluation of the working condition.

These measures however require an increased and thus complex circuit expenditure of measuring electronics, which has a negative impact on the production of capacitive sensor elements and production costs. Moreover by these measures only the effect of external interfering fields or the grounding conditions of the sensor electronics or of an object approaching the sensor electrodes on the measuring signal is reduced, so that a correct evaluation of the measuring signal cannot be guaranteed.

SUMMARY

According to various embodiments a capacitive sensor device and a method for the capacitive approximation detection can be provided which at least partially avoid the disadvantages known from prior art, and with which the reliability and robustness of the sensor function can be increased considerably and the field of application of the capacitive sensor device can be extended.

A capacitive sensor device with an electrode system, comprises
- a first transmitting electrode and a first reception electrode, wherein the first transmitting electrode can be brought into capacitive coupling with the first reception electrode, and
- a second transmitting electrode and a second reception electrode, wherein the second transmitting electrode can be brought into capacitive coupling with the second reception electrode,
- a signal generator for feeding the first transmitting electrode with a first electric alternating signal and the second transmitting electrode with a second electric alternating signal, and
- a signal processing device, which is coupled with the first reception electrode and with the second reception electrode, and which is adapted, to form a first measurement variable from the difference between a first electric value tapped at the first reception electrode and a second electric value tapped at the second reception electrode.

The signal processing device moreover can be adapted, to form a second measurement variable from the sum of the first electric value and the second electric value.

The AC voltage component of the first electric alternating signal can be inverse to the AC voltage component of the second electric alternating signal.

The sensor device can further include an evaluating device, to which the first measurement variable and/or the second measurement variable can be fed and which is adapted to derive an information signal from the first measurement variable and/or the second measurement variable.

Preferably the electrodes are arranged in such a way to each other that an alternating electrical field emitted at the first transmitting electrode couples substantially only into the first reception electrode, and an alternating electrical field emitted at the second transmitting electrode couples substantially only into the second reception electrode.

The electrodes can be arranged in such a way to each other that the second measurement variable is without influence on the capacities formed by the electrodes by an object, or in case of a substantially similar influence substantially zero.

The first electric value and the second electric value can include the electric current coupled into the respective reception electrode (Rx− Rx+) or the voltage resulting at the respective reception electrode (Rx−, Rx+).

A method for the approximation detection of an object is also provided, which comprises at least the following steps:

feeding a first transmitting electrode with a first electric alternating signal and a second transmitting electrode with a second electric alternating signal, so that between the first transmitting electrode and a first reception electrode a first alternating electrical field is formed and between the second transmitting electrode and a second reception electrode a second alternating electrical field is formed, tapping a first electric value at the first reception electrode and a second electric value at the second reception electrode, and generating a first measurement variable by forming the difference between the first electric value and the second electric value.

Preferably a second measurement variable can be formed from the sum of the first electric value and the second electric value.

The electric alternating signals can be selected in such a way, that the AC volt-age component of the first electric alternating signal is inverse to the AC voltage component of the second electric alternating signal.

It is advantageous if the electrodes are arranged in such a way to each other that the first alternating electric field couples substantially only into the first reception electrode, and the second alternating electric field couples substantially only into the second reception electrode.

Moreover an electric device, especially electric hand-held device is provided which presents a capacitive sensor device according to an embodiment.

The electric hand-held device can be a smart phone, a two-way radio, a computer mouse, a remote control device, a digital camera, a game controller, a PDA, a tablet PC, a deaf-aid or similar.

BRIEF DESCRIPTION OF THE DRAWINGS

Further particulars and characteristics of the invention as well as concrete embodiments of the invention result from the following description in connection with the drawing. The figures show.

DETAILED DESCRIPTION

Figure 1:
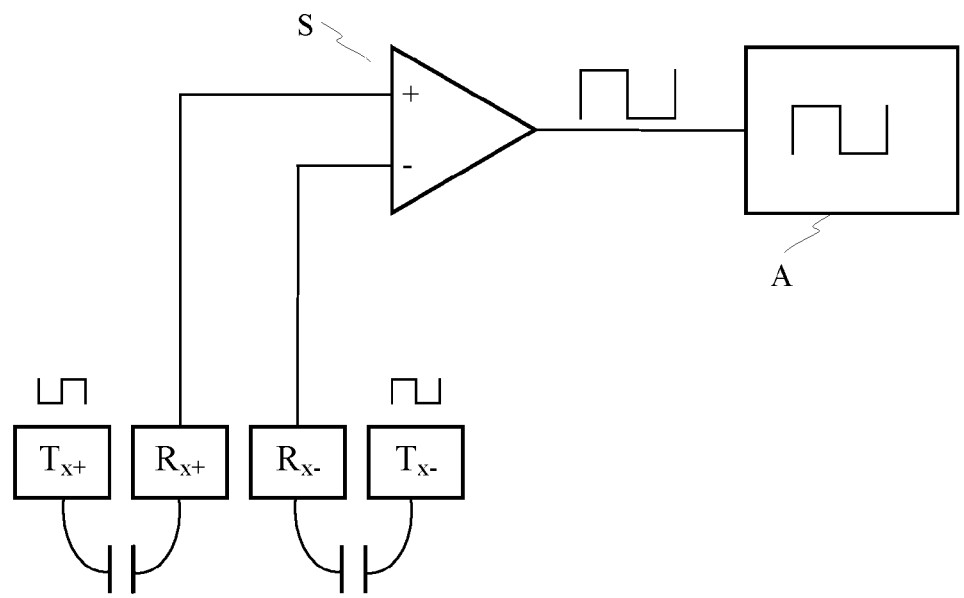
FIG. 1 a principle circuit scheme of a capacitive sensor device according to an embodiment.

FIG. 1 shows a principle circuit scheme of a sensor device according to various embodiments. The capacitive sensor device presents an electrode system, which presents four electrodes. The four electrodes include two transmission electrodes Tx+ and Tx− as well as two reception electrodes Rx+ and Rx−, wherein a first transmitting electrode Tx+ interacts with a first reception electrode Rx+ and wherein a second transmitting electrode Tx− interacts with a second reception electrode Rx−.

The transmission electrodes Tx+ and Tx− are each fed with an electric signal, in which the AC voltage component of the signal admitted at the first transmitting electrode Tx+ is inverse to the AC voltage component signal admitted at the second transmitting electrode Tx−. The first transmitting electrode Tx+ and the first reception electrode Rx+ are arranged in such a way towards each other that between them a capacitive alternating field can be generated. The second transmitting electrode Tx− and the second reception electrode Rx− are also arranged in such a way towards each other that between them also an alternating electrical field can be generated.

At the reception electrodes Rx+ and Rx− each an electrical signal is tapped which are fed to a signal processing device S. The signal processing device S can be formed as differential amplifier and measure the electric current coupled into the reception electrode Rx+ and Rx− or the voltage resulting at the reception electrodes Rx+ and Rx− and form the difference of the two values. By forming the difference of the electric signals tapped at the reception electrodes disturbances by external interfering electric fields are effectively reduced or preferably even eliminated. The electrodes are preferably arranged in such a way to each other that the alternating electric field formed between the first transmitting electrode Tx+ and the first reception electrode Rx+ does not substantially influence the alternating electric field formed between the second transmitting electrode Tx− and the second reception electrode Rx−. This means that the first reception electrode Rx+ substantially measures the alternating electric field emitted at the first transmitting electrode Tx+ and the second receiver electrode Rx− substantially measures the alternating electric field emitted at the second transmitting electrode Tx−.

Moreover the transmission electrodes Tx+ and Tx are coupled each with a signal generator not shown in FIG. 1, which provides two signals which are fed each to one transmitting electrode. The AC voltage component of the first signal provided by the signal generator is inverse to the AC voltage component of the second signal provided by the signal generator. Thus the sum of the AC voltage components of the first and of the second signal is zero.

The signal processing device can be moreover adapted to measure the electric current coupled in the reception electrodes Rx+ and Rx− or the voltage resulting at the reception electrodes Rx+ and Rx− and to form the sum of the two values.

In one embodiment the electrodes or the signals admitted at the transmission electrodes are selected in such a way that the coupling between the first transmission electrode Tx+ and the first reception electrode Rx+ is as great as the coupling between the second transmission electrode Tx− and the second reception electrode Rx−. In this configuration in the evaluation of the composite signal the following information can be derived:

The sum of the received signals is zero when no object approaches the sensor electrodes.

The sum of the reception signals is zero if an object approaches the sensor electrodes in such a way that it influences the alternating electric fields between the first transmission electrode Tx+ and the first reception electrode Rx+ or between the second transmission electrode Tx− and the second reception electrode Rx− similarly or equally.

This can be the case for example if an object—oriented symmetrically to the electrodes—evenly approaches the two electrode pairs Tx+, Rx+ or Tx−, Rx−.

The sum of the reception signals is not equal to zero if an object approaches the sensor electrodes in such a way that it influences the alternating electric fields between the first transmission electrode Tx+ and the first reception electrode Rx+ or between the second transmission electrode Tx− and the second reception electrode Rx− unevenly. This can be the case for example if an object approaches the sensor electrodes unevenly or asymmetrically. The phasing of the composite signal indicates if the asymmetry is more towards the first electrode pair Tx+, Rx+ or more towards the second electrode pair Tx−, Rx−. The amplitude of the composite signal indicates how far the asymmetry is towards the first electrode pair Tx+, Rx+ or the second electrode pair Tx−, Rx−.

The information on phase and/or amplitude of the composite signal can be used for example for producing a slide control (slider) with a number of sensor devices according to various embodiments.

The configuration according to various embodiments shown in FIG. 1 of a capacitive sensor device has the advantage that the detection or the measuring of an approach of a measuring object to the sensor device is independent of external interfering fields and independent of the grounding condition of the approaching object or the measuring electronics.

By forming the difference of the electric signals tapped at the reception electrodes Rx+ and Rx−, external interference signals that influence Rx+ and Rx− similarly are largely eliminated, because the external interference signals influence the electric signals tapped at the reception electrodes Rx+ and Rx− similarly. The interference signal is no longer contained in the measuring signal which is formed by difference formation of the electric signals tapped at the reception electrodes.

In practice however a complete elimination of the interference signals in fact will not be always possible, as the coupling will not always be ideally similar and also the difference formation and signal processing in the measuring system cannot always be ideal. By the doubling of the measuring signal which results from the difference formation of the signals at the reception electrodes and the widest possible elimination of the interference signals in the measuring signal. However the distance between useful and interference signal is considerably increased, so that a possibly still present very small part of the interference signal in the measuring signal can be neglected, without influencing the reliability and stability of the capacitive sensor device substantially.

As the transmission electrodes are inversely controlled to each other, i.e. the first transmitting electrode is fed with an electric alternating signal which is inverse to the alternating signal fed to the second transmitting electrode, Tx++Tx−=0 applies.

Figure 2:
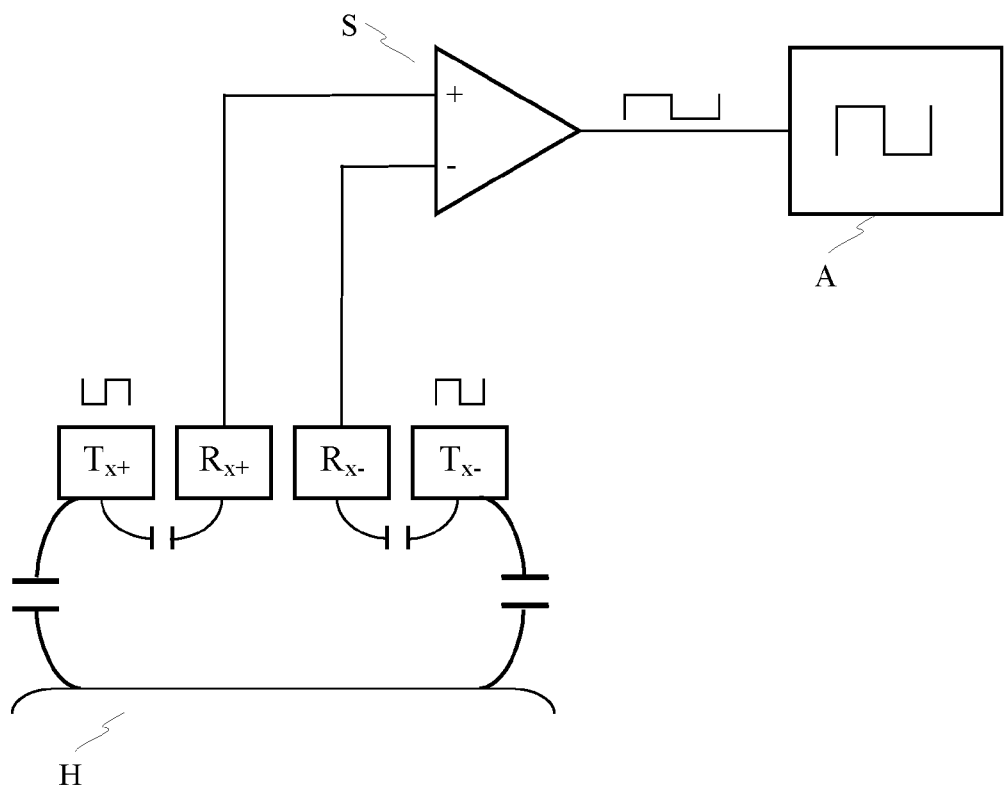
FIG. 2 the effective coupling capacitances of the capacitive sensor device in case of approach of an object to the sensor electrodes of the sensor device.

If an electrically conductive object, for example a hand or a finger, is approached to the sensor in such a way that the coupling between the electrically conductive object and the first transmitting electrode Tx+ and the second transmitting electrode Tx− is identical, the effect, i.e. the current or voltage coupling on the object, is also zero, i. e. not existing. If no current or voltage coupling is present, also the grounding of the user and the sensor electronics or measuring electronics are of no significance or negligible. The effective coupling capacitances in case of an approach of an electrically conductive object to the sensor electrodes of the capacitive sensor device are illustrated in FIG. 2.

At the same time and independently of that, the electrically conductive object approaching the sensor electrodes influences the capacitive coupling between the transmission electrodes Tx+ and Tx− and the reception electrodes Rx+ and Rx−. The sensor function of the capacitive sensor device thus is completely fulfilled, without the grounding conditions of the approaching object or the measuring electronics influencing the measuring signal substantially. The reliability of the sensor function or the capacitive sensor in this way is much improved.

In case of identical coupling of the electrically conductive object with the first transmitting electrode Tx+ and the second transmitting electrode Tx−, the capacitive displacement current between the electrically conductive object and the first transmitting electrode Tx+ will be inverse to the capacitive displacement current between the electrically conductive object and the second transmitting electrode Tx−. Thus the sum of the displacement currents on the electrically conductive object is equal to zero. This means that no current has to leave the electrically conductive object over a grounding capacitance, which means that a grounding capacitance of the electrically conductive object is of no effect on the measuring signal.

Moreover in case of identical coupling of the electrically conductive object with the first transmitting electrode Tx+ and the second transmitting electrode Tx− there is no potential shift of the electrically conductive object. The object can thus be considered virtually grounded. This means that no electric current has to leave the object over a grounding capacitance, which in turn means that a grounding capacitance of the object is of no effect on the measuring signal.

The capacitive sensor according to various embodiments, which has a differential structure, compared to the capacitive sensor devices known from prior art presents much improved properties, especially as for:

resistance against external interfering electric fields, and/or independence from the grounding condition of the electrically conductive object approaching the sensor device and/or from the measuring electronics.

Figure 3:
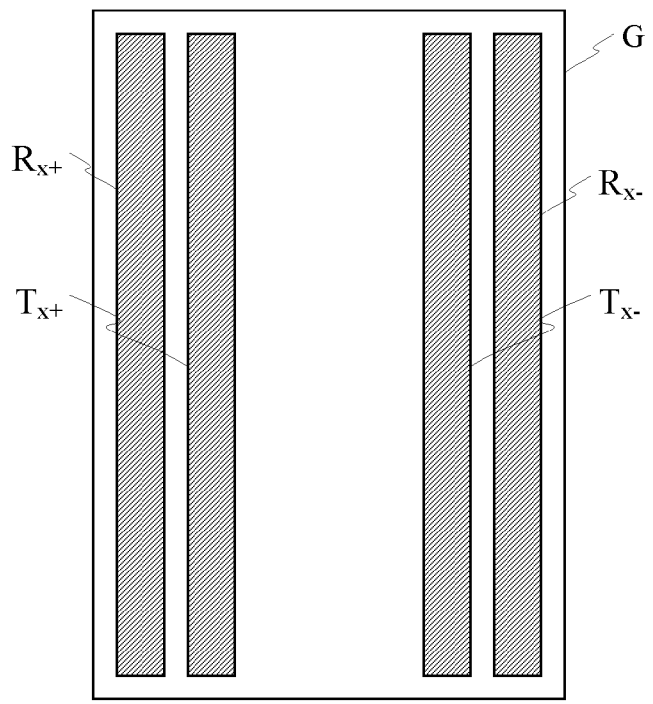
FIG. 3 an electrode arrangement of the capacitive sensor device according to an embodiment at an electric hand-held device, for example a mobile phone.

FIG. 3 shows a housing G of an electric device, for example an electric hand-held device.

Here two electrode pairs are illustrated schematically, in which a first electrode pair is arranged at the left housing wall and a second electrode pair is arranged at the right housing wall. The first electrode pair comprises the first transmitting electrode Tx+ and the first receiver electrode Rx+. The second electrode pair comprises the second transmitting electrode Tx− and the second receiver electrode Rx−. The arrangement of the electrode pairs in relation to each other is here selected in such a way that by the first receiver electrode Rx+ substantially the alternating electric field between the first transmitting electrode Tx+ and the first receiver electrode Rx+ can be measured or evaluated and over the second receiver electrode Rx− substantially the alternating electric field between the second transmitting electrode Tx− and the second receiver electrode Rx− can be measured or evaluated. The arrangement of the two electrode pairs in relation to each other, as shown in FIG. 3, moreover guarantees that the alternating electric fields do not influence each other substantially. This means that the alternating electric field emitted at the first transmitting electrode Tx+ substantially only couples into the first receiver electrode Rx+ and the alternating electric field emitted at the second transmitting electrode Tx− substantially only couples into the second receiver electrode Rx−.

If a user grasps the electric hand-held device G with one hand, the electrodes of the left electrode pair and the electrodes of the right electrode pair are at least partially covered by the hand. This entails, that a part of the alternating electric field of the first transmitting electrode Tx+ couples over the hand into the first receiver electrode Rx+ and a part of the alternating electric field emitted at the second transmitting electrode Tx− couples over the hand into the second reception electrode Rx−. By forming the difference of the electric signals tapped at the two receiver electrodes Rx+ or Rx−, influences of the grounding of the user or the measuring electronics are effectively eliminated so that only the alternating electric fields effectively emitted at the respective transmission electrodes Tx+ or Tx− enter the measuring signal.

By the totaling of the electric signals tapped at the receiving electrodes Rx+ and Rx− it can moreover be checked if the electric hand-held device is really grasped in such a way that a hand grasping the hand-held device G really covers both electrode pairs at least partially. If the sum of the two electric signals tapped at the receiving electrodes Rx+ and Rx− is zero or near zero, it can be supposed that the electric hand-held device is really grasped by a hand. For this purpose a threshold value can be foreseen. If the sum of the electric signals tapped at the receiver electrodes is smaller than the threshold value, a grasping of the hand-held device can be supposed. Preferably this threshold value is adjustable.

Figure 4:
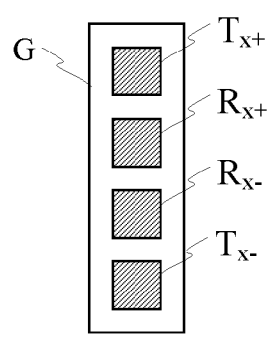
FIG. 4 the arrangement of the sensor electrodes of a capacitive sensor device according to an embodiment on a housing of a hearing-aid.

FIG. 4 shows a housing shell G of a deaf-aid.

In this example the sensor electrodes of the capacitive sensor device are arranged side by side, while the receiving electrodes Rx+ and Rx− are arranged between the transmission electrodes Tx+ and Tx−, respectively. The electric alternating signals admitted at the respective transmission electrodes Tx+ and Tx− are adapted in such a way, that the alternating electric field emitted at the transmitting electrode Tx+ couples substantially only into the reception electrode Rx+ and the alternating electric field emitted at the transmitting electrode Tx− couples substantially only into the reception electrode Rx−.

What is claimed is:

1. Capacitive sensor device with an electrode system, comprising:

a first transmitting electrode and a first reception electrode, wherein the first transmitting electrode is capacitively coupled with the first reception electrode, and a second transmitting electrode and a second reception electrode, wherein the second transmitting electrode is capacitively coupled with the second reception electrode, a signal generator for feeding the first transmitting electrode with a first electric alternating signal and the second transmitting electrode with a second electric alternating signal wherein the first and second reception electrode receive signals from the first and second transmitting electrodes, respectively and wherein the first reception electrode provides a respective first electric value and the second reception electrode provides a respective second electric value, and a signal processing device, which is coupled with the first reception electrode and with the second reception electrode, and wherein the signal processing device forms a first measurement variable from the difference between the first electric value and the second electric value and wherein the signal processing device further forms a second measurement variable from the sum of the first electric value and the second electric value, wherein the first electric variable substantially reduces the influence of interfering electric fields and the second electric variable is non-zero in response to an object to be detected approaching the first and second transmitting electrodes unevenly, and wherein the AC voltage component of the first electric alternating signal is inverse to the AC voltage component of the second electric alternating signal.

2. The sensor device according to claim 1, further comprising an evaluating device, to which the first and second measurement variables are fed and which derives an information signal from the first and second measurement variables.

3. The sensor device according to claim 1, wherein the first transmitting and reception electrodes are arranged at a left side of a device housing and the second transmitting and reception electrodes are arranged at a right side of a device housing and extend in parallel to each other and wherein each electrode forms an elongated strip.

4. The sensor device according to claim 3, wherein the first and second reception electrodes are arranged between the first and second transmission electrodes.

5. The sensor device according to claim 1, wherein the electrodes are arranged in such a way to each other that an alternating electrical field emitted at the first transmitting electrode substantially couples only into the first reception electrode, and an alternating electrical field emitted at the second transmitting electrode substantially couples only into the second reception electrode.

6. The sensor device according to claim 1, wherein the electrodes are spaced apart from each other such that a first alternating electric field formed between the first transmitting electrode and the first reception electrode does not influence a second alternating electric field formed between the second transmitting electrode and the second reception electrode.

7. The sensor device according to claim 1, wherein the first electric value and the second electric value comprise the electric current coupled into the respective reception electrode or the voltage resulting at the respective reception electrode.

8. The sensor device according to claim 1, wherein the electrodes are arranged coplanar and spaced apart from each other such that in case of a substantially similar influence the second measurement variable is substantially zero.

9. The sensor device according to claim 1, wherein the arrangement of the electrode pairs in relation to each other is selected in such a way that the first reception electrode substantially measures the alternating electric field between the first transmitting electrode and the first reception electrode and the second reception electrode substantially measures the alternating electric field between the second transmitting electrode and the second reception electrode.

10. A method for the approximation detection of an object, comprising at least the following steps:
Applying a first electric alternating signal to a first transmitting electrode and a second electric alternating signal to a second transmitting electrode so that between the first transmitting electrode and a first reception electrode a first alternating electrical field is formed and between the second transmitting electrode and a second reception electrode a second alternating electrical field is formed, wherein the first and second electric alternating signals are selected in such a way that the AC voltage component of the first electric alternating signal is inverse to the AC voltage component of the second electric alternating signal,
receiving a first electric value at the first reception electrode and a second electric value at the second reception electrode, and
generating a first measurement variable by forming the difference between the first electric value and the second electric value, and
generating a second measurement variable by forming the sum of the first electric value and the second electric value, and
wherein the first electric variable substantially reduces the influence of interfering electric fields and the second electric variable is non-zero in response to the object approaching the first and second transmitting electrodes unevenly.

11. The method according to claim 10, wherein the first transmitting and reception electrodes are arranged at a left side of a device housing and the second transmitting and reception electrodes are arranged at a right side of a device housing in such a way to each other that
the first alternating electric field substantially couples only into the first reception electrode, and
the second alternating electric field substantially couples only into the second reception electrode.

12. An electric device with a capacitive sensor device with an electrode system, comprising:
a first transmitting electrode and a first reception electrode, wherein the first transmitting electrode is capacitively coupled with the first reception electrode, and
a second transmitting electrode and a second reception electrode, wherein the second transmitting electrode is capacitively coupled with the second reception electrode,
a signal generator for feeding the first transmitting electrode with a first electric alternating signal and the second transmitting electrode with a second electric alternating signal, and
a signal processing device, which is coupled with the first reception electrode and with the second reception electrode, and which forms a first measurement variable from the difference between a first electric value received from the first reception electrode and a second electric value received from the second reception electrode and a second measurement variable from the sum of the first electric value and the second electric value,
wherein the first electric variable substantially reduces the influence of interfering electric fields and the second electric variable is non-zero in response to an object approaching the first and second transmitting electrodes unevenly, and
wherein the AC voltage component of the first electric alternating signal is inverse to the AC voltage component of the second electric alternating signal.

13. The electric device according to claim 12, further comprising an evaluating device, to which the first and second measurement variables are fed and which derives an information signal from the first and second measurement variables.

14. The electric device according to claim 12, wherein the first transmitting and reception electrodes are arranged at a left side of a device housing and the second transmitting and reception electrodes are arranged at a right side of a device housing and extend in parallel to each other and wherein each electrode forms an elongated strip.

15. The electric device according to claim 14, wherein a first electrode pair is arranged adjacent to a left housing wall and a second electrode pair is arranged adjacent to a right housing wall, wherein the first electrode pair comprises the first transmitting electrode and the first reception electrode and the second electrode pair comprises the second transmitting electrode and the second reception electrode.

16. The electric device according to claim 14, wherein the first and second reception electrodes are arranged between the first and second transmission electrodes.

17. The electric device according to claim 12, wherein the electrodes are arranged in such a way to each other that
an alternating electrical field emitted at the first transmitting electrode substantially couples only into the first reception electrode, and
an alternating electrical field emitted at the second transmitting electrode substantially couples only into the second reception electrode.

18. The electric device according to claim 12, wherein the electrodes are spaced apart from each other such that a first alternating electric field formed between the first transmitting electrode and the first reception electrode does not influence a second alternating electric field formed between the second transmitting electrode and the second reception electrode.

19. The electric device according to claim 12, wherein the first electric value and the second electric value comprise the electric current coupled into the respective reception electrode or the voltage resulting at the respective reception electrode.

20. The electric device according to claim 12, wherein the electric device is a handheld device.

21. The electric device according to claim 12, wherein the electrodes are arranged coplanar and spaced apart from each other such that in case of a substantially similar influence the second measurement variable is substantially zero.

22. The electric device according to claim 12, wherein the arrangement of the electrode pairs in relation to each other is selected in such a way that the first reception electrode substantially measures the alternating electric field between the first transmitting electrode and the first reception electrode and the second reception electrode substantially measures the alternating electric field between the second transmitting electrode and the second reception electrode.

\* \* \* \* \*